(12) United States Patent
Ivanov

(10) Patent No.: US 6,377,034 B1
(45) Date of Patent: Apr. 23, 2002

(54) METHOD AND CIRCUITS FOR INDUCTOR CURRENT MEASUREMENT IN MOS SWITCHING REGULATORS

(75) Inventor: Vadim V. Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/733,282

(22) Filed: Dec. 11, 2000

(51) Int. Cl.$^7$ .............................. G05F 1/40; G05F 1/44
(52) U.S. Cl. ........................................ 323/287; 323/224
(58) Field of Search ................................ 323/222, 224, 323/268, 280, 286, 287, 285, 290

(56) References Cited

U.S. PATENT DOCUMENTS

| | | | | |
|---|---|---|---|---|
| 4,427,903 A | | 1/1984 | Sugimoto | 307/355 |
| 4,998,526 A | * | 3/1991 | Gokhale | 123/598 |
| 5,081,379 A | | 1/1992 | Korteling | 307/530 |
| 5,420,777 A | | 5/1995 | Muto | 363/21 |
| 5,483,182 A | | 1/1996 | Rybicki | 327/5 |
| 5,568,044 A | * | 10/1996 | Bittner | 323/272 |
| 5,600,234 A | * | 2/1997 | Hastings et al. | 323/282 |
| 5,614,812 A | * | 3/1997 | Wagoner | 323/222 |
| 5,614,850 A | * | 3/1997 | Corsi et al. | 327/55 |
| 5,731,731 A | | 3/1998 | Wilcox et al. | 327/403 |
| 5,757,635 A | * | 5/1998 | Seong | 363/89 |
| 5,808,883 A | | 9/1998 | Hawkes | 363/60 |
| 5,850,113 A | * | 12/1998 | Weimer et al. | 307/125 |
| 6,038,154 A | * | 3/2000 | Boylan et al. | 363/127 |
| 6,163,139 A | * | 12/2000 | Symonds | 323/222 |
| 6,211,623 B1 | * | 4/2001 | Wilhelm et al. | 315/224 |

OTHER PUBLICATIONS

MAX887 DC–DC converter, Maxim Integrated Products, 19–1142 Rev 0:9/96.

* cited by examiner

Primary Examiner—Bao Q. Vu
(74) Attorney, Agent, or Firm—W. Daniel Swayze, Jr.; W. James Brady; Frederick J. Telecky, Jr.

(57) ABSTRACT

An inductor current measurement circuit (25) accurately measures current supplied to an inductor (17) by a first transistor (2) and/or a second transistor (3). The first transistor (2) has a drain coupled to an input voltage conductor (8), a gate coupled to a switching signal (4), and a source coupled to a the first terminal of an inductor 17. A first sense transistor (7) has a gate and a drain connected to the gate and train, respectively, of the first transistor (2), and a source coupled to a first input of a first amplifier (13) and a drain of a third transistor (12) having a source coupled to a second supply voltage conductor (9), and a gate connected to the gate of a fourth transistor (15). The source of the fourth transistor (15) is connected to the second supply voltage conductive (9) and its drain is connected to an output terminal (18) and a second terminal coupled to the second supply voltage conductor (9). The first transistor (2) and second transistor (3) are included in a DC-DC converter. A second sense transistor (10) has a gate connected to the gate of the second transistor (3) and a drain connected to the drain of the second transistor (3) and to the first terminal of the inductor (17). The source all the second sense transistor (10) is coupled to the output terminal (18). The first and second transistors are operated so that one is on while the other is off, such that the current through the output terminal represents the current through the inductor regardless of which of the first and second transistors supplies the inductor current.

10 Claims, 2 Drawing Sheets

METHOD AND CIRCUITS FOR INDUCTOR CURRENT MEASUREMENT IN MOS SWITCHING REGULATORS

BACKGROUND OF THE INVENTION

The invention relates to the precise measurement of inductor current, especially for controlling switching in MOS voltage regulator circuits and electric motor controllers.

It is necessary to accurately measure current in order to accomplish control of electric current motors and also to accomplish control of DC-DC converter circuits and voltage regulator circuits. Usually, inductor current measurement for such purposes is accomplished by connection of a low-resistance (e.g., one ohm) resistor connected in series with the inductor conducting the current. U.S. Pat. Nos. 5,731,731 and 5,420,777 disclose this conventional technique. However, providing accurate, low value resistors in an integrated circuit is problematic. Use of the above mentioned series resistor both increases power dissipation of current measurement circuitry and reduces the efficiency of a regulator that includes the current measurement circuitry.

A prior circuit, the MAX887 DC-DC converter marketed by Maxim Integrated Circuits, Inc., measures current through an inductor by connecting a low-resistance resistor between the source electrodes of a relatively large P-channel output transistor and a relatively small P-channel sense transistor having their gate electrodes connected together and also having their drain electrodes connected together, wherein most of the inductor current flows through the output transistor. This technique cannot be used effectively to measure small inductor currents of less than about 10 percent of the maximum inductor current when the output transistor is operating in its so-called "triode mode". This is because the output voltage measured across the resistor for such low inductor currents is a very nonlinear function of the inductor current. Furthermore, the current in the sense transistor is heavily dependent both on MOS or CMOS processing parameters and on the temperature of the integrated circuit chip. Consequently, the inductor current measurement is not as accurate as desirable.

U.S. Pat. No. 5,483,182 discloses circuitry for both measurement of an inductor current and for current limiting of a "low-side" MOS transistor switch in a DC-DC converter. The circuitry includes a reference current source, a comparator, and a sense transistor. The circuit has the shortcoming that it can be used only for current limitation and only for a low-side switch. The circuit would not work properly for, or in conjunction with, the high-side switch of a DC-DC converter, and cannot be used in conjunction with operation of a low-side switch in a synchronous rectifier mode.

Other known current-sensing circuitry, shown in U.S. Pat. No. 5,081,379, has the shortcoming that it is not capable of detecting current if the low-side MOS transistor switch is operated in a synchronous rectifier mode; this prevents the circuit from being useful in measurement of an inductor current connected in an ordinary half bridge connection.

Thus, there is a need for an improved MOS switching regulator circuit, and specifically for an efficient, substantially process-independent, substantially temperature-independent circuit which can be used for precisely measuring inductor current in an MOS switching regulator circuit, motor controller circuit, or the like.

SUMMARY OF THE INVENTION

Accordingly, it is an object of the invention to provide an improved MOS switching regulator circuit.

It is another object of the invention to provide an improved circuit for measuring inductor currents so as to make it practical to provide a MOS switching regulator circuit with improved speed and improved stability.

It is another object of the invention to provide an improved circuit for measuring inductor current over a wide range of values.

It is another object of the invention to provide an improved circuit for measuring inductor current over a wide range of values, wherein the measurement is substantially independent of chip temperature and chip processing parameters.

It is another object of the invention to provide an improved circuit for measuring inductor currents so as to make it practical to provide a MOS switching motor control circuit.

It is another object of the invention to provide an improved low power circuit for measuring inductor currents so as to make it practical to provide a MOS switching voltage regulator circuit or a MOS switching motor control circuit.

Briefly described, and in accordance with one embodiment thereof, the invention provides an inductor current measurement circuit (25) accurately measures current supplied to an inductor (17) by a first transistor (2) and/or a second transistor (3). The first transistor (2) has a drain coupled to an input voltage conductor (8), a gate coupled to a switching signal (4), and a source coupled to a the first terminal of an inductor (17). A first sense transistor (7) has a gate and a drain connected to the gate and train, respectively, of the first transistor (2), and a source coupled to a first input of a first amplifier (13) and a drain of a third transistor (12) having a source coupled to a second supply voltage conductor (9), and a gate connected to the gate of a fourth transistor (15). The source of the fourth transistor (15) is connected to the second supply voltage conductive (9) and its drain is connected to an output terminal (18) and a second terminal coupled to the second supply voltage conductor (9). The first transistor (2) and second transistor (3) are included in a DC-DC converter. A second sense transistor (10) has a gate connected to the gate of the second transistor (3) and a drain connected to the drain of the second transistor (3) and to the first terminal of the inductor (17). The source all the second sense transistor (10) is coupled to the output terminal (18). The first and second transistors are operated so that one is on while the other is off, such that the current through the output terminal represents the current through the inductor regardless of which of the first and second transistors supplies the inductor current.

DETAILED DESCRIPTION OF THE PREFERRED EMBODIMENTS

Figure 1:
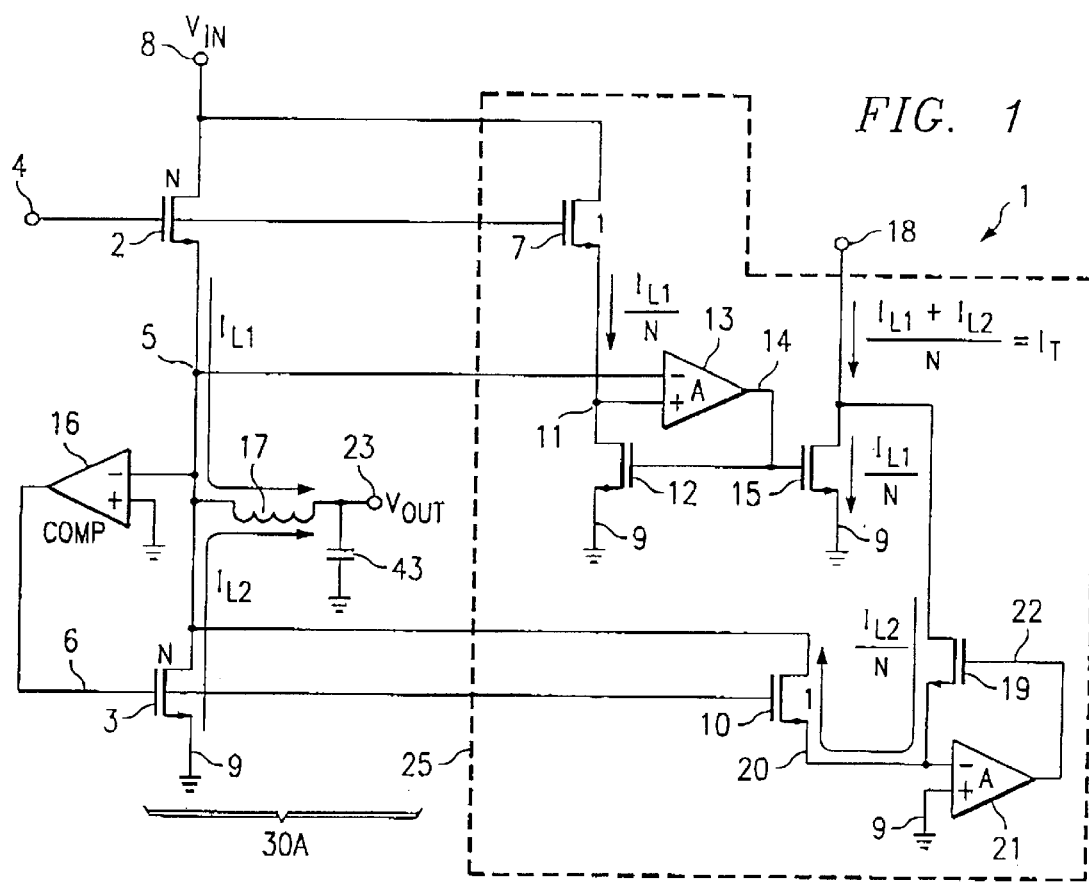
FIG. 1 is a schematic diagram of a preferred embodiment of the invention.

Referring to FIG. 1, circuit 1 includes an output stage 30A of a subsequently described DC-DC converter (which is shown in subsequently described FIG. 3) and an inductor current measurement circuit 25 shown within the dashed lines. DC-DC converter output stage 30A includes N-channel transistors 2 and 3 and an external inductor 17. Inductor current measurement circuit 25 includes N-channel sense transistors 7 and 10, N-channel transistors 12, 15 and 19, differential amplifier 13, and differential amplifier 21.

DC-DC output stage 30A includes an N-channel output transistor or MOSFET 2 (also referred to as a "high-side" transistor) and an N-channel output transistor 3 (also referred to as a "low-side" transistor) having its drain connected by conductor 5 to the source of high-side transistor 2. (Incidentally, those skilled in the art know that the source and drain electrodes of an MOS transistor can interchange roles during operation of the transistor. For example, for in an N-channel transistor, the current-carrying electrode having the highest voltage at any particular time during circuit operation is the source electrode at that time, but that same electrode may become the drain of the same transistor at another time during circuit operation. Therefore, the terms "source" and "drain" as used herein and in the claims to identify the current-carrying electrode of an MOS transistor are not intended to limit the function performed by the current-carrying electrode with respect to whether it is functioning as a source or a drain at a particular time in the circuit operation.)

The gate of high-side transistor 2 of DC-DC converter 30 is connected by conductor 4 to an input terminal which receives a pulse width modulated (PWM) signal to control the switching of high-side transistor 2 and low-side transistor 3 in order to control the regulation of the DC-DC converter mentioned above. The drain of high-side transistor 2 is connected to $V_{IN}$. The source of high-side transistor 2 is connected to the drain of low-side transistor 3 and also to a first terminal of external inductor 17. The second terminal of inductor 17 is connected by conductor 23 to the output of the DC-DC converter. An output capacitor 43 is connected between output conductor 23 and conductor 9.

As subsequently explained with reference to FIG. 3, low-side transistor 3 must operate synchronously with high-side transistor 2. One way of accomplishing the synchronous operation is to provide a comparator 16 having its (−) input coupled to conductor 5, its (+) input connected to ground conductor 9, and its output connected by conductor 6 to the gate of low-side transistor 3. (Note that the lower voltage supply conductor 9 can be, but not does not have to be, a ground conductor.)

The structure of inductor current measurement circuit 25 is described next. The gate of high-side transistor 2 is connected to the gate of P-channel sense transistor 7, the drain of which is connected to $V_{IN}$. The source of sense transistor 7 is connected by conductor 11 to the drain of N-channel transistor 12, the source of which is connected to conductor 9. The channel-width-to-channel-length ratio of sense transistor 7 is 1/N times that of high side transistor 2. Conductors 5 and 11 are connected, respectively, to the (−) and (+) inputs, respectively, of a differential amplifier 13, the output of which is connected by conductor 14 to the gate of N-channel transistor 12 and also to the gate of N-channel transistor 15, the drain of which is connected to output conductor 18 and the source of which is connected to conductor 9.

Above mentioned conductor 6 connects the gate of low-side transistor 3 to the gate of sense transistor 10, which has its drain connected to conductor 5. The channel-width-to-channel-length ratio of low-side transistor 3 is N times that of sense transistor 10. The source of sense transistor 10 is connected by conductor 20 to the source of an N-channel transistor 19, the drain of which is connected to output conductor 18. Conductor 20 also is connected to the (−) input of a differential amplifier 21, the (+) input of which is connected to conductor 9. The output of amplifier 21 is connected by conductor 22 to the gate of transistor 19.

The current in inductor 17 flows either from $V_{IN}$ through high-side transistor 2 into inductor 17 as indicated by $I_{L1}$ if high-side transistor 2 is on, or from conductor 9 through low-side transistor 3 into inductor 17 as indicated by $I_{L2}$ if low-side transistor 3 is on. High-side transistor 2 and low-side transistor 3 are operated synchronously such that if either one of them is on, the other is off.

Figure 3:
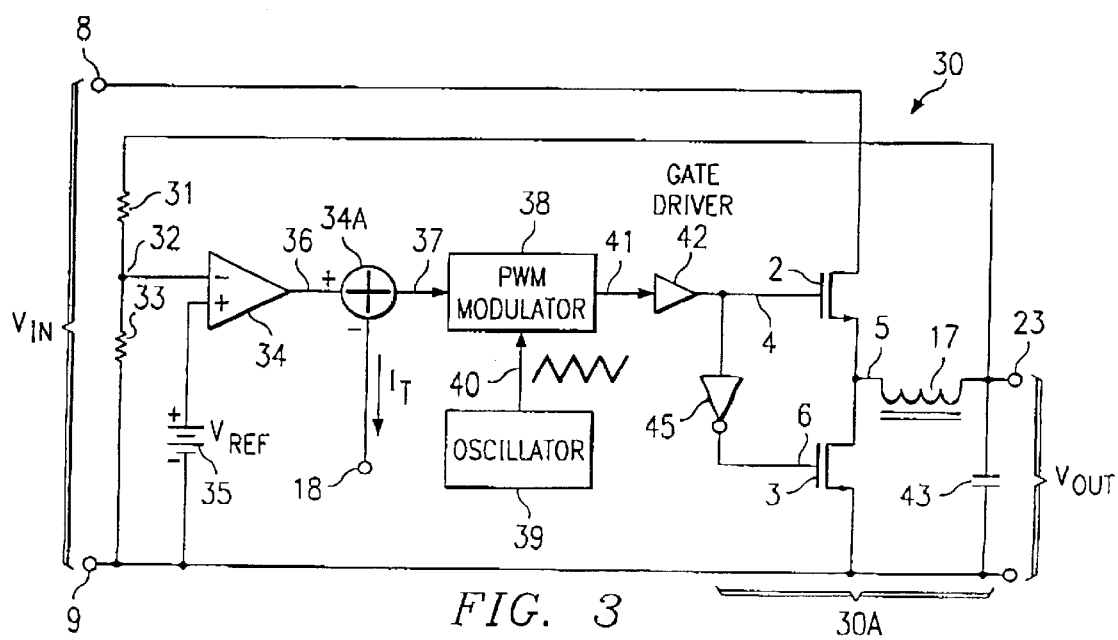
FIG. 3 is a block diagram of a switching regulator circuit that incorporates the inductor current measurement circuit of FIGS. 1 and 2.

Before describing the operation of inductor current measurement circuit 25 in detail, it may be helpful to understand the basic structure and operation of DC-DC converter 30 of FIG. 3, because inductor current measurement circuit 25 preferably is used in conjunction with DC-DC converter 30. However, current measurement circuit 25 actually may be used to measure any current supplied into a conductor such as conductor 5 by any transistor such as high-side transistor 2 or low-side transistor 3. Referring to FIG. 3, DC-DC converter 30 includes supply voltage terminals 8 and 9 across which an unregulated input voltage $V_{IN}$ is applied. DC-DC converter 30 produces a regulated output voltage $V_{OUT}$ between output conductor 23 and common conductor 9. Output stage 30A has already been described with reference to FIG. 1, except that comparator 16 has been omitted, and instead the PWM signal produced on conductor 4 is inverted by inverter 45 to produce a complementary gate drive signal on conductor 6 which turns low-side transistor 3 on when high side transistor 2 is turned off, and vice versa.

The regulated output signal $V_{OUT}$ on conductor 23 is fed back and applied across a resistive voltage divider including resistors 31 and 33. Resistor 31 is connected between conductor 23 and conductor 32. Resistor 33 is connected between conductor 32 and conductor 9. Thus, an attenuated feedback signal on conductor 32 is applied to the (−) input of a differential error amplifier 34, the (+) input of which is connected to a reference voltage source 35 producing a reference voltage $V_{REF}$.

The output of amplifier 34 is connected by conductor 36 to the (+) input of a current summing circuit 34A having a (−) input connected to output conductor 18 of FIG. 1 in which the measurement current $I_T$ representative of the current in inductor 17 flows. The output of current summing circuit 34A is connected by conductor 37 to the input of a pulse width modulator (PWM modulator) 38, which is a conventional circuit that can be easily implemented a variety of ways by one skilled in the art. An ordinary oscillator circuit 39 produces a sawtooth clock signal 40 which is applied to the input of PWM modulator 38 and is modulated by the amplified feedback signal produced on conductor 37 by error amplifier 34. PWM modulator 38 produces a PWM signal 41 which is applied to the input of a conventional driver circuit 42 that produces the above mentioned PWM control signal 4 to drive the gate of high-side transistor 2.

PWM modulator 38 thereby modulates the oscillator signal 40 in accordance with the output of error amplifier 34 and the subsequently explained measurement current $I_T$ produced by inductor current measurement circuit 25 of FIG. 1 to control switching of high-side transistor 2 and low-side transistor 3 so as to cause $V_{OUT}$ to have a regulated value equal to $V_{REF}$ multiplied by a function of the resistances of resistors 31 and 32.

Next, the operation of the circuitry shown in FIG. 1 will be described. There are two components of the current flowing from conductor 5 through external inductor 17 to terminal 23. One component is $I_{L1}$, which flows through high-side transistor 2. Since the channel-width-to-channel-length ratio of high-side transistor 2 is N times that of sense transistor 7, a current $I_{L1}/N$ flows through sense transistor 7. Differential amplifier 13 operates to provide feedback to control the gate-to-source voltage of sense transistor 7, thereby controlling the gate voltage of transistor 12 such that the voltages on conductors 5 and 11 are essentially equal and the current flowing through transistors 7 and 12 is $I_{L1}/N$. If, for example, transistors 12 and 15 are matched, the current $I_{L1}/N$ is mirrored through transistor 12.

If the rate of change of the total current flowing through inductor 17 decreases enough that a back-emf (back-electromotive force) is developed across inductor 17, that causes the voltage of conductor 5 to fall below ground. Then the drain electrodes of transistors 3 and 10 functionally become source electrodes, and the current $I_{L2}$ flows from ground conductor 9 through low-side transistor 3 and inductor 17 as shown. Since the channel-length-to-channel-width ratio of transistor 3 is N times larger than transistor 10, a current $I_{L2}/N$ is mirrored from transistor 3 to flow through sense transistor 10. Amplifier 21 provides feedback to transistor 19 to adjust the gate-to-source voltage of transistor 19 so that $I_{L2}/N$ flows through sense transistor 10, and hence also flows through transistor 19 and through terminal 18, assuming that transistor 19 has the same channel-width-to-channel-length ratio as transistor 10.

Therefore, the total measurement current $I_T$ flowing through output terminal 18 is the sum of $I_{L1}/N$ plus $I_{L2}/N$. Actually, measurement current $I_T$ is equal to $I_{L1}/N$ or $I_{L2}/N$ because the synchronous operation of high-side transistor 2 and low-side transistor 3 ensures that only one of them is on at any particular time.

The measurement current $I_T$ of inductor current measurement circuit 1 produces very high accuracy in measurement of the current in inductor 17 over a wide range of values, because the accuracy of the measurement current $I_T$ is limited mainly by the matching of the power transistors 2 and 3 with their corresponding sense transistors 7 and 10 and by the input offset voltages of the differential amplifiers. Inductor current measurement circuit 25 can be integrated on a single integrated circuit chip along with the portion of DC-DC converter circuit 30 other than external inductor 17 and external output capacitor 43 without the need for additional external leads of the DC-DC converter. The inductor current measurement circuit 25 provides very accurate measurement of the current in the external inductor 17, and this allows very accurate regulation of $V_{OUT}$ by the DC-DC converter by providing a "current mode" of operation.

Figure 4:
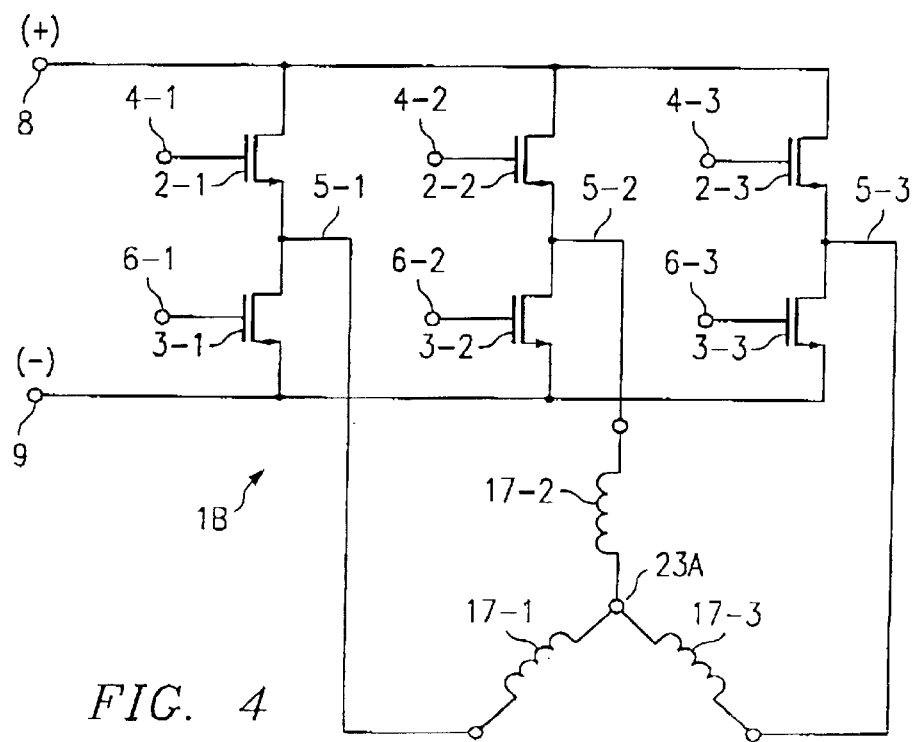
FIG. 4 is a diagram of an electric motor controller circuit that includes an inductor current measuring circuit in accordance with the present invention.

FIG. 4 shows a circuit 1B that provides winding current measurement information that is useful in motor control. Referring to FIG. 4, a three-phase winding arrangement of an electric motor includes windings 17-1, 17-2 and 17-3. The arrangement of FIG. 1 can be used to accurately measure the currents in windings 17-1, 17-2, and 17-3. The accurate current measurement information than can be used by a motor control circuit that is generally analogous to the regulators circuit of FIG. 3 to control of the motor.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

Figure 2:
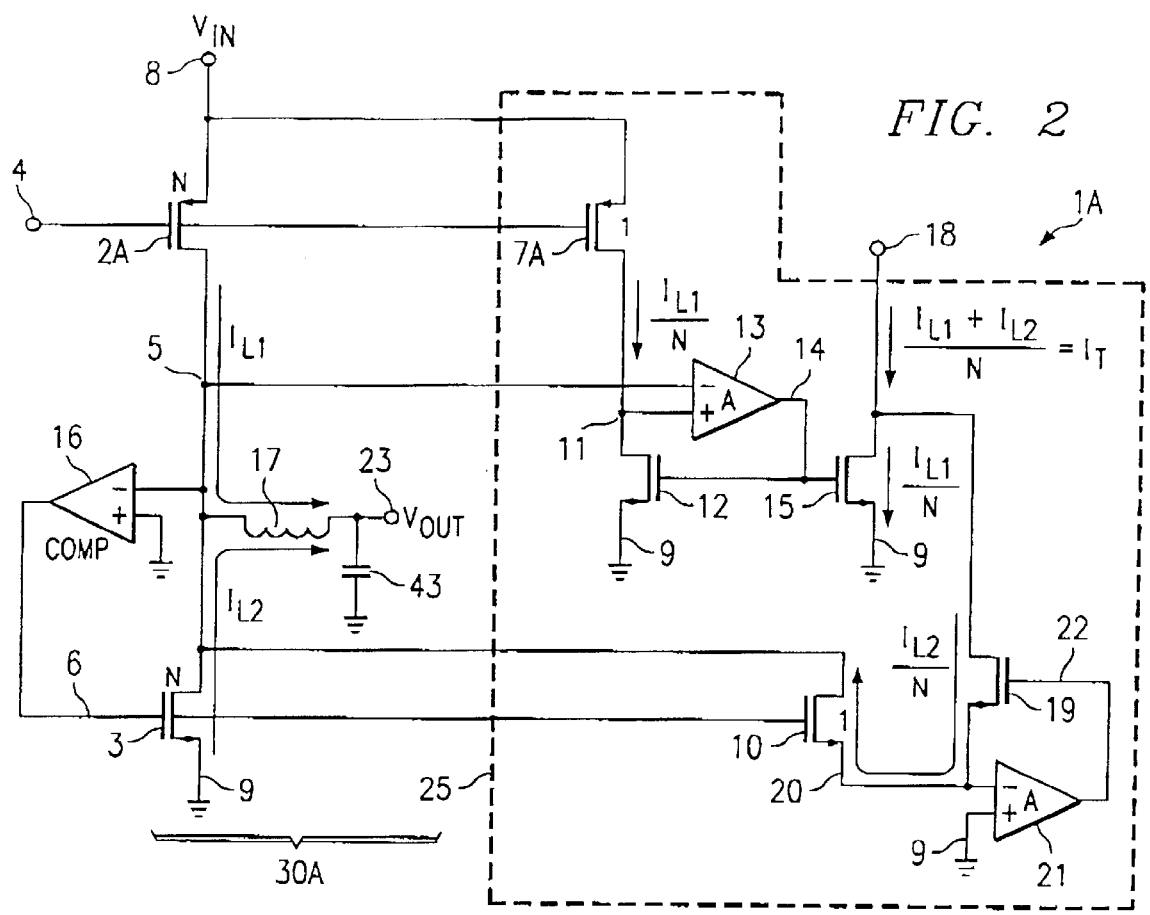
FIG. 2 is a schematic diagram of a CMOS implementation of the invention.

For example, the N-channel high-side transistor 2 and sense transistor 7 of FIG. 1 can be replaced by P-channel high-side transistor 2A and sense transistor 7A as shown in FIG. 2, although use of N-channel transistors requires to three times less chip area and therefore usually would be preferable.

The function of the arrangement including PWM modulator 38 and oscillator 40 in FIG. 3 could be accomplished by those skilled in the art in various other ways, for example by using a controlled delay circuit or a clocked logic circuit.

What is claimed is:

1. A circuit for measuring current in an inductor, the current being supplied to the inductor by a first transistor or a second transistor, the first and second transistors each having a first electrode, a second electrode, and a control electrode the first transistor having its second electrode coupled to a first conductor, its control electrode coupled to a switching signal and its first electrode coupled to the second electrode of the second transistor and to a terminal of the inductor, the second transistor having its first electrode coupled to a second conductor, the measuring circuit comprising:

(a) a first sense transistor having its control electrode and its second electrode coupled to the control electrode and second electrode, respectively, of the first transistor;

(b) a second sense transistor having its control electrode and its second electrode coupled to the control electrode and second electrode, respectively, of the second transistor;

(c) a first circuit including a third transistor having its second electrode coupled to the first electrode of the first sense transistor and its first electrode coupled to a second conductor, a fourth transistor having its control electrode and its first electrode coupled to the control electrode and the source electrode, respectively, of the third transistor and its first electrode coupled to the summing node, and a first differential amplifier having first and second inputs coupled to the first electrodes of the first transistor and the first sense transistor, respectively, and an output coupled to the control electrode is of the third and forth transistors; and (d) a second circuit including a fifth transistor having its first electrode coupled to the first electrode of the second sense transistor and to a first input of a second differential amplifier having a second input coupled to the second conductor and an output coupled to the control electrode of the fifth transistor, the fifth transistor having its first electrode coupled to the summing node.

2. A circuit for measuring current in an inductor, the current being supplied to the inductor by a first transistor or a second transistor, the first transistor having a drain coupled to a first conductor, a gate coupled to a switching signal and a source coupled to a drain of the second transistor and to a terminal of the inductor, the second transistor having a source coupled to a second conductor, the measuring circuit comprising:

(a) a first sense transistor having a gate and drain coupled to the gate and drain, respectively, of the first transistor;

(b) a second sense transistor having a gate and drain coupled to the gate and drain, respectively, of the second transistor;

(c) a first circuit including a third transistor having a drain coupled to the source of the first sense transistor and a source coupled to a second conductor, a fourth transistor having a gate and source coupled to the gate and the source, respectively, of the third transistor and a drain coupled to the summing node, and a first differential amplifier having first and second inputs coupled to the sources of the first transistor and the first sense transistor, respectively, and an output coupled to the gates of the third and forth transistors; and (d) a second circuit including a fifth transistor having a source coupled to the source of the second sense transistor and to pay first input of a second differential amplifier having a second input coupled to the second conductor and an output coupled to a gate of the fifth transistor, the fifth transistor having a drain coupled to the summing node.

3. The current measuring circuit of claim 2 wherein the first and second transistors, first and second sense transistors, and third, fourth and fifth transistors are N-channel transistors.

4. The current measuring circuit of claim 2 wherein the first transistor and the first sense transistor are P-channel transistors.

5. The current measuring circuit of claim 3 wherein the first transistor is a high-side transistor of a switching voltage converter circuit including the inductor, and the second transistor is a low-side transistor of the switching voltage converter circuit.

6. The current measuring circuit of claim 2 including synchronizing circuitry connected to turn the second transistor off while the first transistor is on and vice versa.

7. A switching voltage converter circuit comprising:

(a) an inductor;

(b) a first transistor and a second transistor, the first transistor having a drain coupled to a first conductor, a gate coupled to a switching signal and a source coupled to a drain of the second transistor and to a first terminal of the inductor, the second transistor having a source coupled to a second conductor, a second terminal of the inductor being coupled to an output conductor of the switching voltage converter circuit;

(c) an error amplifier having a first input coupled to the output conductor, a second input coupled to a reference voltage, and an output coupled to a first input of a summing circuit;

(d) a duty cycle modulator circuit having an input coupled to an output of the summing circuit and an output coupled to a driver circuit connected to synchronously drive the gates of the first transistor and second transistor so that one of the first and second transistors is off while the other is on and vice versa;

(e) an inductor current measuring circuit including

I. a first sense transistor having a gate and drain coupled to the gate and drain, respectively, of the first transistor, ii. a second sense transistor having a gate and drain coupled to the gate and drain, respectively, of the second transistor, iii. a first circuit including a third transistor having a drain coupled to the source of the first sense transistor and a source coupled to the second conductor, a fourth transistor having a gate and source coupled to the gate and the source, respectively, of the third transistor and a drain coupled to a current summing conductor coupled to a second input of the summing circuit 34A, and a first differential amplifier having first and second inputs coupled to the sources of the first transistor and the first sense transistor, respectively, an output of the first differential amplifier being coupled to gates of the third and fourth transistors, and iv. a second circuit including a fifth transistor having a source coupled to the source of the second sense transistor and to a first input of a second differential amplifier having a second input coupled to the second conductor and an output coupled to a gate of the fifth transistor, the fifth transistor having a drain coupled to the summing node.

8. An electric motor controller circuit for controlling an electric motor including an inductive winding comprising:

(a) a first transistor and a second transistor, the first transistor having a drain coupled to a first conductor, a gate coupled to a switching signal and a source coupled to a drain of the second transistor and to a first terminal of the winding, the second transistor having a source coupled to a second conductor, a second terminal of the winding being coupled to an output conductor of the electric motor controller circuit;

(b) an error amplifier having a first input coupled to the output conductor, a second input coupled to a reference voltage, and an output coupled to a first input of a summing circuit;

(c) a duty cycle modulator circuit having an input coupled to an output of the summer and an output coupled to driver circuit connected to synchronously drive the gates of the first transistor and second transistor so that one of them is off while the other is on and vice versa;

(d) an current measuring circuit for measuring current in the inductive winding, the current measuring circuit including I. a first sense transistor having a gate and drain coupled to the gate and drain, respectively, of the first transistor, ii. a second sense transistor having a gate and drain coupled to the gate and drain, respectively, of the second transistor, iii. a first circuit including a third transistor having a drain coupled to the source of the first sense transistor and a source coupled to the second conductor, a fourth transistor having a gate and source coupled to the gate and the source, respectively, of the third transistor and a drain coupled to a current summing conductor coupled to a second input of the current summing circuit, and a first differential amplifier having first and second inputs coupled to the sources of the first transistor and the first sense transistor, respectively, an output although first differential amplifier being coupled to gates of the third and forth transistors, and iv. a second circuit including a fifth transistor having a source coupled to the source of the second sense transistor and to a first input of a second differential amplifier having a second input coupled to the second conductor and an output coupled to a gate of the fifth transistor, the fifth transistor having a drain coupled to the summing node.

9. A method for measuring current in an inductor, the current being supplied to the inductor by a first transistor or a second transistor, the first transistor having a drain coupled to a first conductor, a gate coupled to a switching signal and a source coupled to a drain of the second transistor and to a terminal of the inductor, the second transistor having a source coupled to a second conductor, the measuring method comprising:

(a) operating a first feedback circuit to maintain a source of a first sense transistor having a gate and drain coupled to the gate and the drain, respectively, of the first transistor at the same voltage as the source of the first transistor, and operating a first current mirror circuit to mirror the current in the first sense transistor so as to cause a first mirrored current to flow in a current summing conductor; and (b) operating a second feedback circuit to maintain the source of a second sense transistor having a gate and a drain coupled to the gate and the drain of the second transistor, respectively, of the second transistor at the same voltage as the source of the second transistor, and operating a second current mirror circuit so as to cause a second mirrored current to flow in the current summing conductor, the sum of the first and second mirrored current representing the current through the inductor.

10. The method of claim 9 wherein step (a) includes coupling a first input of a first differential amplifier to the source of the first transistor, coupling a second input of the first differential amplifier to the source of the first sense transistor, and coupling an output of the first differential amplifier to gate electrodes of a third transistor and a fourth transistor having sources connected to a common conductor and coupling a drain of the of the fourth transistor to the current summing conductor, and wherein step (b) includes coupling the drain of the second transistor to a first input of a second differential amplifier by means of the second sense transistor, the second differential amplifier having a second input coupled to a source of the second transistor and an output coupled to a gate of a fifth transistor, and coupling the fifth transistor between the current summing conductor and the first input of the second differential amplifier.

* * * * *